(12) United States Patent
Yun et al.

(10) Patent No.: US 9,660,848 B2
(45) Date of Patent: May 23, 2017

(54) METHODS AND STRUCTURES TO GENERATE ON/OFF KEYED CARRIER SIGNALS FOR SIGNAL ISOLATORS

(71) Applicant: Analog Devices Global, Hamilton (BM)

(72) Inventors: Ruida Yun, Weston, MA (US); Yuanjie Sun, Beijing (CN); Baoxing Chen, Westford, MA (US)

(73) Assignee: Analog Devices Global, Hamilton (BM)

( * ) Notice: Subject to any disclaimer, the term of this patent is extended or adjusted under 35 U.S.C. 154(b) by 0 days.

(21) Appl. No.: 14/486,937

(22) Filed: Sep. 15, 2014

(65) Prior Publication Data

US 2016/0080181 A1    Mar. 17, 2016

(51) Int. Cl.
  *H04L 27/04*  (2006.01)
  *H03B 5/12*   (2006.01)
  *H03C 1/60*   (2006.01)

(52) U.S. Cl.
  CPC ........... *H04L 27/04* (2013.01); *H03B 5/1215* (2013.01); *H03B 5/1228* (2013.01); *H03C 1/60* (2013.01)

(58) Field of Classification Search
  CPC .................................. H04L 27/04; H04B 1/04
  USPC .................................................. 375/295, 312
  See application file for complete search history.

(56) References Cited

U.S. PATENT DOCUMENTS

| | | | |
|---|---|---|---|
| 3,058,078 A | 10/1962 | Hoh | |
| 3,537,022 A | 10/1970 | Regan | |
| 3,714,540 A | 1/1973 | Galloway | |
| 3,760,198 A | 9/1973 | Mori et al. | |
| 3,798,608 A | 3/1974 | Huebner | |
| 3,808,673 A | 5/1974 | Bottini | |
| 4,024,452 A | 5/1977 | Seidel | |
| 4,027,152 A | 5/1977 | Brown et al. | |

(Continued)

FOREIGN PATENT DOCUMENTS

| | | |
|---|---|---|
| DE | 2529296 A1 | 1/1977 |
| DE | 19718420 A1 | 11/1998 |

(Continued)

OTHER PUBLICATIONS

"IEEE Standard for a High Performance Serial Bus", IEEE Std 1394-1995, Microprocessor and Microcomputer Standards Committee, 1996, pp. i-viii, pp. 1-384.

(Continued)

*Primary Examiner* — Kevin M Burd
(74) *Attorney, Agent, or Firm* — Wolf, Greenfield & Sacks, P.C.

(57) ABSTRACT

An oscillator for a signal isolator system includes a capacitor and an inductor connected in parallel, two pairs of cross-coupled switches and a control switch. The capacitor, the inductor and the cross-coupled switches form an oscillator. The control switch controls operation of the oscillator between an ON state and an OFF state in response to a data signal to be communicated across an isolation barrier. The inductor may be formed from a winding of an isolation transformer, which reduces component count as compared to a system that provides a separate inductor. Other embodiments may include a current-supplying kickstart circuit and a shorting transistor that can speed transition between the ON and OFF states.

29 Claims, 7 Drawing Sheets

(56) References Cited

U.S. PATENT DOCUMENTS

| | | |
|---|---|---|
| 4,035,710 A | 7/1977 | Joyce |
| 4,065,713 A | 12/1977 | Pollmeier |
| 4,118,603 A | 10/1978 | Kumhyr |
| 4,159,431 A | 6/1979 | Roozenbeek et al. |
| 4,227,045 A | 10/1980 | Chelcun et al. |
| 4,275,404 A | 6/1981 | Cassiday et al. |
| 4,302,807 A | 11/1981 | Mentler |
| 4,318,170 A | 3/1982 | Cabalfin |
| 4,321,487 A | 3/1982 | Huykman |
| 4,352,998 A | 10/1982 | Baker et al. |
| 4,443,839 A | 4/1984 | Onodera et al. |
| 4,475,149 A | 10/1984 | Gallios |
| 4,538,136 A | 8/1985 | Drabing |
| 4,547,961 A | 10/1985 | Bokil et al. |
| 4,554,462 A | 11/1985 | Komiya et al. |
| 4,564,768 A | 1/1986 | Komiya et al. |
| 4,660,014 A | 4/1987 | Wenaas et al. |
| 4,703,283 A | 10/1987 | Samuels |
| 4,720,667 A | 1/1988 | Lee et al. |
| 4,748,419 A | 5/1988 | Somerville |
| 4,780,795 A | 10/1988 | Meinel |
| 4,785,345 A | 11/1988 | Rawls et al. |
| 4,817,865 A | 4/1989 | Wray |
| 4,818,855 A | 4/1989 | Mongeon et al. |
| 4,825,450 A | 4/1989 | Herzog |
| 4,835,486 A | 5/1989 | Somerville |
| 4,845,466 A | 7/1989 | Hariton et al. |
| 4,859,877 A | 8/1989 | Cooperman et al. |
| 4,864,589 A | 9/1989 | Endo |
| 4,885,582 A | 12/1989 | LaBarge et al. |
| 4,912,617 A | 3/1990 | Hartmann et al. |
| 4,920,474 A | 4/1990 | Bruning et al. |
| 4,922,883 A | 5/1990 | Iwasaki |
| 4,924,210 A | 5/1990 | Matsui et al. |
| 4,937,468 A | 6/1990 | Shekhawat et al. |
| 4,945,264 A | 7/1990 | Lee et al. |
| 4,959,631 A | 9/1990 | Hasegawa et al. |
| 5,041,780 A | 8/1991 | Rippel |
| 5,057,968 A | 10/1991 | Morrison |
| 5,095,357 A | 3/1992 | Andoh et al. |
| 5,102,040 A | 4/1992 | Harvey |
| 5,128,729 A | 7/1992 | Alonas et al. |
| 5,136,455 A | 8/1992 | Billingsley |
| 5,142,432 A | 8/1992 | Schneider |
| 5,164,621 A | 11/1992 | Miyamoto |
| 5,204,551 A | 4/1993 | Bjornholt |
| 5,260,967 A | 11/1993 | Schilling |
| 5,270,882 A | 12/1993 | Jove et al. |
| 5,293,400 A | 3/1994 | Monod et al. |
| 5,325,355 A | 6/1994 | Oprescu et al. |
| 5,327,030 A | 7/1994 | DeVito et al. |
| 5,329,225 A | 7/1994 | Roshen et al. |
| 5,334,882 A | 8/1994 | Ting |
| 5,339,061 A | 8/1994 | Reick |
| 5,353,001 A | 10/1994 | Meinel et al. |
| 5,369,666 A | 11/1994 | Folwell et al. |
| 5,384,808 A | 1/1995 | Van Brunt et al. |
| 5,394,319 A | 2/1995 | Attwood et al. |
| 5,396,394 A | 3/1995 | Gee |
| 5,430,641 A | 7/1995 | Kates |
| 5,450,305 A | 9/1995 | Boys et al. |
| 5,467,607 A | 11/1995 | Harvey |
| 5,469,098 A | 11/1995 | Johnson, Jr. |
| 5,484,012 A | 1/1996 | Hiratsuka |
| 5,488,627 A | 1/1996 | Hardin et al. |
| 5,533,054 A | 7/1996 | DeAndrea et al. |
| 5,539,241 A | 7/1996 | Abidi et al. |
| 5,539,598 A | 7/1996 | Denison et al. |
| 5,572,179 A | 11/1996 | Ito et al. |
| 5,588,021 A | 12/1996 | Hunt et al. |
| 5,596,466 A | 1/1997 | Ochi |
| 5,631,920 A | 5/1997 | Hardin |
| 5,636,110 A | 6/1997 | Lanni |
| 5,650,357 A | 7/1997 | Dobkin et al. |
| 5,701,037 A | 12/1997 | Weber et al. |
| 5,714,938 A | 2/1998 | Schwabl |
| 5,716,323 A | 2/1998 | Lee |
| 5,731,954 A | 3/1998 | Cheon |
| 5,757,338 A | 5/1998 | Bassetti et al. |
| 5,774,350 A | 6/1998 | Notaro et al. |
| 5,774,791 A | 6/1998 | Strohallen et al. |
| 5,781,071 A | 7/1998 | Kusunoki |
| 5,781,077 A | 7/1998 | Leitch et al. |
| 5,786,979 A | 7/1998 | Douglass |
| 5,801,602 A | 9/1998 | Fawal et al. |
| 5,812,598 A | 9/1998 | Sharma et al. |
| 5,825,259 A | 10/1998 | Harpham |
| 5,831,426 A | 11/1998 | Black, Jr. et al. |
| 5,831,525 A | 11/1998 | Harvey |
| 5,877,667 A | 3/1999 | Wollesen |
| 5,900,683 A | 5/1999 | Rinehart et al. |
| 5,900,764 A | 5/1999 | Imam et al. |
| 5,907,481 A | 5/1999 | Svardsjo |
| 5,913,817 A | 6/1999 | Lee |
| 5,926,358 A | 7/1999 | Dobkin et al. |
| 5,942,937 A | 8/1999 | Bell |
| 5,952,849 A | 9/1999 | Haigh |
| 5,969,590 A | 10/1999 | Gutierrez |
| 5,990,753 A | 11/1999 | Danstrom et al. |
| 5,998,979 A | 12/1999 | Nilsson |
| 6,000,128 A | 12/1999 | Umeno et al. |
| 6,025,705 A | 2/2000 | Nguyen et al. |
| 6,040,986 A | 3/2000 | Sakamoto et al. |
| 6,049,258 A | 4/2000 | Fawal et al. |
| 6,054,780 A | 4/2000 | Haigh et al. |
| 6,069,802 A | 5/2000 | Priegnitz |
| 6,087,882 A | 7/2000 | Chen et al. |
| 6,104,003 A | 8/2000 | Jones |
| 6,124,756 A | 9/2000 | Yaklin et al. |
| 6,208,174 B1 | 3/2001 | Hopkins |
| 6,208,531 B1 | 3/2001 | Vinciarelli et al. |
| 6,249,171 B1 | 6/2001 | Yaklin et al. |
| 6,255,863 B1 | 7/2001 | Yamauchi et al. |
| 6,262,600 B1 | 7/2001 | Haigh et al. |
| 6,266,254 B1 | 7/2001 | Ohtake |
| 6,291,907 B1 | 9/2001 | Haigh et al. |
| 6,300,617 B1 | 10/2001 | Daughton et al. |
| 6,317,338 B1 | 11/2001 | Boys |
| 6,344,979 B1 | 2/2002 | Huang et al. |
| 6,359,983 B1 | 3/2002 | Krone et al. |
| 6,377,646 B1 | 4/2002 | Sha |
| 6,389,063 B1 | 5/2002 | Kanekawa et al. |
| 6,501,363 B1 | 12/2002 | Hwu et al. |
| 6,504,732 B2 | 1/2003 | Abe |
| 6,525,566 B2 | 2/2003 | Haigh et al. |
| 6,538,532 B2 | 3/2003 | Petrovic |
| 6,542,385 B1 | 4/2003 | Emmons et al. |
| 6,553,057 B1 | 4/2003 | Sha et al. |
| 6,603,383 B2 | 8/2003 | Gevorgian et al. |
| 6,603,807 B1 | 8/2003 | Yukutake et al. |
| 6,606,260 B2 | 8/2003 | Ahlstrom |
| 6,611,051 B2 | 8/2003 | Akiyama et al. |
| 6,621,365 B1 | 9/2003 | Hallivuori et al. |
| 6,686,768 B2 | 2/2004 | Comer |
| 6,720,816 B2 | 4/2004 | Strzalkowski |
| 6,728,320 B1 | 4/2004 | Khasnis et al. |
| 6,738,240 B1 | 5/2004 | Ahn et al. |
| 6,747,421 B2 | 6/2004 | Kohn |
| 6,765,809 B2 | 7/2004 | Komori |
| 6,807,070 B2 | 10/2004 | Ribarich |
| 6,873,065 B2 | 3/2005 | Haigh et al. |
| 6,903,578 B2 | 6/2005 | Haigh et al. |
| 6,911,848 B2 | 6/2005 | Vinciarelli |
| 6,911,860 B1 | 6/2005 | Wang et al. |
| 6,922,080 B2 | 7/2005 | Haigh et al. |
| 6,927,662 B2 | 8/2005 | Kahlmann et al. |
| 6,977,522 B1 | 12/2005 | Murabayashi et al. |
| 6,993,087 B2 | 1/2006 | Rosnell et al. |
| 7,010,621 B2 | 3/2006 | Calkins et al. |
| 7,016,490 B2 | 3/2006 | Beutler et al. |
| 7,061,189 B2 | 6/2006 | Newman, Jr. et al. |
| 7,075,329 B2 | 7/2006 | Chen et al. |
| 7,098,766 B2 | 8/2006 | Gardner et al. |
| 7,102,388 B2 | 9/2006 | Murabayashi et al. |

(56) References Cited

U.S. PATENT DOCUMENTS

| | | |
|---|---|---|
| 7,113,750 B2 | 9/2006 | Eastwood |
| 7,116,183 B2 | 10/2006 | Wu |
| 7,171,739 B2 | 2/2007 | Yang et al. |
| 7,199,562 B2 | 4/2007 | Muterspaugh |
| 7,253,565 B2 | 8/2007 | Kang et al. |
| 7,277,491 B2 | 10/2007 | Dong et al. |
| 7,334,417 B2 | 2/2008 | Tokushige et al. |
| 7,376,212 B2 | 5/2008 | Dupuis |
| 7,477,676 B2 | 1/2009 | Kokubo et al. |
| 7,489,526 B2 | 2/2009 | Chen et al. |
| 7,545,059 B2 | 6/2009 | Chen et al. |
| 7,548,440 B2 | 6/2009 | Chen et al. |
| 7,613,016 B2 | 11/2009 | Chen et al. |
| 7,671,372 B2 | 3/2010 | Morikawa |
| 7,683,654 B2 | 3/2010 | Chen et al. |
| 7,692,444 B2 | 4/2010 | Chen et al. |
| 7,706,154 B2 | 4/2010 | Chen et al. |
| 7,719,305 B2 | 5/2010 | Chen |
| 7,881,461 B2 | 2/2011 | Skov et al. |
| 7,902,627 B2 | 3/2011 | Dong et al. |
| 7,919,781 B2 | 4/2011 | Wang et al. |
| 7,920,010 B2 | 4/2011 | Chen, Jr. et al. |
| 7,923,710 B2 | 4/2011 | Crawley et al. |
| 8,084,894 B2 | 12/2011 | Chen |
| 8,116,055 B2 | 2/2012 | Baumgartner et al. |
| 8,169,108 B2 | 5/2012 | Dupuis et al. |
| 8,364,195 B2 | 1/2013 | Spina et al. |
| 8,428,539 B2 | 4/2013 | Dupuis |
| 8,502,584 B1 | 8/2013 | Dong et al. |
| 8,618,787 B1 | 12/2013 | Quinn |
| 8,693,528 B1 | 4/2014 | Shrestha et al. |
| 8,724,355 B1 | 5/2014 | Pinkhasov et al. |
| 8,736,343 B2 | 5/2014 | Chen et al. |
| 8,867,592 B2 | 10/2014 | Shrestha |
| 2003/0042571 A1 | 3/2003 | Chen et al. |
| 2003/0052712 A1 | 3/2003 | Comer |
| 2003/0075990 A1 | 4/2003 | Guitton et al. |
| 2003/0107411 A1 | 6/2003 | Martin et al. |
| 2003/0163748 A1 | 8/2003 | Calkins et al. |
| 2004/0076221 A1 | 4/2004 | Refaeli et al. |
| 2004/0184289 A1 | 9/2004 | Vinciarelli |
| 2005/0008113 A1 | 1/2005 | Kokubo et al. |
| 2005/0033902 A1 | 2/2005 | Tamura |
| 2005/0047511 A1 | 3/2005 | Dosho et al. |
| 2005/0272378 A1 | 12/2005 | Dupuis |
| 2005/0288739 A1 | 12/2005 | Hassler et al. |
| 2006/0039169 A1 | 2/2006 | Chen et al. |
| 2006/0120115 A1 | 6/2006 | Chen et al. |
| 2007/0052399 A1 | 3/2007 | Chen et al. |
| 2007/0052514 A1 | 3/2007 | Chen et al. |
| 2007/0133144 A1 | 6/2007 | Lewis |
| 2007/0258513 A1 | 11/2007 | Strzalkowski |
| 2008/0094046 A1 | 4/2008 | Chen et al. |
| 2008/0311862 A1 | 12/2008 | Spina et al. |
| 2008/0315925 A1 | 12/2008 | Alfano et al. |
| 2009/0168462 A1 | 7/2009 | Schopfer et al. |
| 2009/0184754 A1 | 7/2009 | Chen |
| 2009/0195082 A1 | 8/2009 | Chen |
| 2010/0052430 A1 | 3/2010 | Takaishi et al. |
| 2010/0106041 A1* | 4/2010 | Ghovanloo .......... A61B 5/0031 600/544 |
| 2010/0111218 A1 | 5/2010 | Chen, Jr. |
| 2010/0329364 A1 | 12/2010 | Giombanco et al. |
| 2011/0248787 A1* | 10/2011 | Jiang ...................... 331/117 FE |
| 2012/0025921 A1* | 2/2012 | Yang ...................... 331/117 FE |
| 2012/0212251 A1 | 8/2012 | Yanagishima et al. |
| 2013/0106515 A1 | 5/2013 | Lin |
| 2013/0285465 A1 | 10/2013 | Takeda et al. |
| 2014/0062527 A1 | 3/2014 | Mills et al. |
| 2014/0169038 A1* | 6/2014 | Kamath et al. ................ 363/16 |
| 2014/0286446 A1 | 9/2014 | Takeda et al. |
| 2015/0236698 A1* | 8/2015 | Pedersen ........................... 326/8 |

FOREIGN PATENT DOCUMENTS

| | | |
|---|---|---|
| DE | 19922129 C1 | 9/2000 |
| DE | 19922123 A1 | 11/2000 |
| DE | 19922127 A1 | 11/2000 |
| DE | 19922128 C1 | 1/2001 |
| DE | 10100282 A1 | 7/2002 |
| EP | 0282102 A2 | 9/1988 |
| EP | 0307345 A1 | 3/1989 |
| EP | 0586062 A1 | 3/1994 |
| EP | 0708529 A2 | 4/1996 |
| EP | 0917309 A2 | 5/1999 |
| EP | 0977406 A1 | 2/2000 |
| EP | 1209791 A2 | 5/2002 |
| EP | 2282405 A2 | 2/2011 |
| EP | 1171980 B1 | 11/2011 |
| EP | 1550194 B1 | 11/2012 |
| FR | 2679670 A1 | 1/1993 |
| GB | 2173956 A | 10/1986 |
| JP | S57132460 A | 8/1982 |
| JP | S58215833 A | 12/1983 |
| JP | H07115768 A | 5/1995 |
| JP | H0937558 A | 2/1997 |
| JP | H10191654 A | 7/1998 |
| JP | 2002508916 A | 3/2002 |
| JP | 2002262545 A | 9/2002 |
| JP | 2011-134347 A | 7/2011 |
| WO | 81/00658 A1 | 3/1981 |
| WO | 95/05033 A1 | 2/1995 |
| WO | WO-9520768 A1 | 8/1995 |
| WO | WO-9837672 A1 | 8/1998 |
| WO | WO-9848541 A2 | 10/1998 |
| WO | WO-9921332 A1 | 4/1999 |
| WO | WO-0128094 A1 | 4/2001 |
| WO | WO-0161951 A1 | 8/2001 |
| WO | WO-02073914 A1 | 9/2002 |
| WO | WO-02086969 A2 | 10/2002 |
| WO | WO-200586062 A2 | 9/2005 |
| WO | 2012/085951 A1 | 6/2012 |
| WO | WO-2014036594 A1 | 3/2014 |

OTHER PUBLICATIONS

Akiyama et al., "A High-Voltage Monolithic Isolator for a Communication Network Interface," IEEE Transactions on Electron Devices, vol. 49, No. 5, May 2002, pp. 895-901.

All About Circuits, "An Electric Pendulum", Textbook, vol. II—Alternating Circuit (AC), Chapter 6: Resonance, allaboutcircuits.com, Jul. 12, 2004, 5 pages.

Analog Devices, "Frequently Asked Questions: Isolation, iCoupler Technology, and iCoupler Products", Mar. 2006, 10 pages.

Analog Devices, "High Speed Digital Isolators", ADuM1100AR / ADuM1100BR datasheet, Rev. 0, 2001, 12 pages.

Analog Devices, "High Speed, Logic Isolator With Power Transformer", AD260 datasheet, Rev. 0, Sep. 1998, 8 pages.

Analog Devices, "iCoupler Digital Isolation Products", 2005, 12 pages.

Analog Devices, "iCoupler Isolation in RS-232 Applications", Application Note AN-740, Rev. 0, Jul. 2004, 8 pages.

Analog Devices, "iCoupler Isolation in RS-485 Applications", Application Note AN-727, Rev. 0, Jun. 2004, 12 pages.

Analog Devices, "Low Cost, Miniature Isolation Amplifiers", AD202 / AD204 datasheet, Rev. B, 1994, 12 pages.

Avago Technologies, "Dual-Channel High Speed 15 MBd CMOS Optocoupler", QCPL-073H datasheet, Jul. 2007, 10 pages.

Avago Technologies, "Single-Channel High Speed 15 MBd CMOS Optocoupler" QCPL-070H datasheet, Jul. 2007, 10 pages.

Banerjee and Kliger, "Micromachined Magnetics: a New Step in the Evolution of Isolation Technology", Electronic Engineering, Jun. 2000, pp. 27-32.

Baumann, "Free-Running Bridge Inverter", IBM Technical Disclosure Bulletin, vol. 9, No. 10, Mar. 1967, p. 1462.

Bourgeois, "PCB Based Transformer for Power MOSFET Drive", IEEE, 1994, pp. 238-244.

(56) References Cited

OTHER PUBLICATIONS

Burr-Brown, "Dual, Isolated, Bi-Directional Digital Coupler", ISO150 datasheet, 3 versions, 1993-2007, 38 pages.
Business Wire, "Emerson Selects Analog Devices' Digital Isolation Technology for Industrial Systems; ADI's iCoupler Technology Enables Low-Cost Signal Isolation in High-Temperature Environments", Sep. 24, 2003, 2 pages.
Business Wire, "Pulse's New Miniature Transformers are Optimized for Wideband RF Applications", Jul. 26, 2000, 2 pages.
Chang et al., "A Spread-Spectrum Clock Generator with Triangular Modulation", IEEE Journal of Solid-State Circuits, vol. 38, No. 4, Apr. 2003, pp. 673-676.
Chen et al., "High Speed Digital Isolators Using Microscale On-Chip Transformers", Elektronik, Jul. 22, 2003, English version, 6 pages.
Chiu et al., "Thin-Film Inductive Heads", IBM J. Res. Develop., vol. 40, No. 3, May 1996, pp. 283-300.
Christiansen, "Pulse-Code Modulation (PCM)", Electronics Engineers' Handbook, Fourth Edition, McGraw-Hill, Inc., 1996, 3 pages (unnumbered).
Chu et al., "High-Voltage CMOS Decoder/Driver for Plasma Displays", 1976 IEEE International Solid-State Circuits Conference (ISSCC 76), Digest of Technical Papers, vol. XIX, Feb. 1976, pp. 212-213.
Cypress Semiconductor, "Spread Spectrum Clock Generator", SM560 datasheet, Rev. E, Jun. 2004, 8 pages.
Cypress Semiconductor, "Spread Spectrum Clock Generator", SM561 datasheet, Rev. C, Dec. 2002, 8 pages.
Dotter et al., "Implementation of an Adaptive Balancing Hybrid", IEEE Transactions on Communications, vol. 28, No. 8, Aug. 1980, pp. 1408-1416.
EDN Network, "Welcome to the 17th Annual EDN Innovation Awards: EDN's 2006 Innovation Awards Nominees—Nominee Detail—ADuM125xI2C Digital Isolators (Analog Devices)", Reed Business Information, 2007, 2 pages.
EE Times Asia, "ADI Digital Isolators Reduce Per-Channel Costs", New Products, Jun. 19, 2003, 1 page.
EE Times Online, "EE Times Names ACE Finalists", Latest News, Jan. 15, 2007, 3 pages.
El-Hammanmsy, "Design of High-Efficiency RF Class-D Power Amplifier", IEEE Transactions on Power Electronics, vol. 9, No. 3, May 1994, pp. 297-308.
Fleming, "Isolation Amplifiers Break Ground Loops and Achieve High CMRR", EDN, vol. 32, No. 26, Dec. 24, 1987, pp. 97-102, and p. 5.
Gallo et al., "An Unity High Power Factor Power Supply Rectifier Using a PWM AC/DC Full Bridge Soft-Switching", 17th Annual IEEE Applied Power Electronics Conference and Exposition (APEC 2002), Mar. 2002, pp. 1190-1194.
Geen et al., "Miniature Multilayer Spiral Inductors for GaAs MMICs", 11th Annual IEEE Gallium Arsenide Integrated Circuit (GaAs IC) Symposium, Oct. 22-25, 1989, Technical Digest, pp. 303-306.
Ghiorse and Ranta, "Isolation in Medical Applications", Power Electronics Europe, Jul. 2005, 2 pages.
Greenhouse, "Design of Planar Rectangular Microelectronic Inductors", IEEE Transactions on Parts, Hybrids, and Packaging, vol. 10, No. 2, Jun. 1974, pp. 101-109.
Hermann et al., "Magnetically Coupled Linear Isolator", IEEE Transactions on Magnetics, vol. 33, No. 5, Sep. 1997, pp. 4029-4031.
International Microcircuits, "Low EMI Spectrum Spread Clock", SM530 datasheet, Rev. 1.6, Jan. 1999, 16 pages.
Irvine, "Early Digital Computers at Bell Telephone Laboratories", IEEE Annals of the History of Computing, Jul.-Sep. 2001, pp. 22-42.
Jaycar Electronics, "DC-DC Converters: A Primer", DCDCONV Reference Data Sheet, 2001, 5 pages.
Kehrer, "Design of Monolithic Integrated Lumped Transformers in Silicon-based Technologies up to 20 GHz", Master's thesis, Technical University of Vienna, Institute of Communications and Radio-Frequency Engineering, Dec. 2000, 85 pages.
Kester, "Digital Isolation Techniques", Practical Design Techniques for Sensor Signal Conditioning, Section 10: Hardware Design Techniques, Analog Devices, Inc., 1999, pp. 10.55-10.57.
Kester, "Origins of Real-World Signals and Their Units of Measurement", Mixed Signal and DSP Design Techniques, Section 1: Introduction, Newnes, 2003, pp. 1.1-1.10.
Kliger et al., "Isolation with Waferscale Transformers", Digital Isolation, Power Electronics Europe, Issue 6, 2005, pp. 40-43.
Kliger, "Integrated Transformer-Coupled Isolation", IEEE Instrumentation & Measurement Magazine, Mar. 2003, pp. 16-19.
Knoedl, Jr., et al., "A Monolithic Signal Isolator", 4th Annual IEEE Applied Power Electronics Conference and Exposition (APEC '89), Mar. 13-17, 1989, Conference Proceedings, pp. 165-170.
Kojima et al., "2.3 kVac 100 MHz Multi-Channel Monolithic Isolator IC," 12th International Symposium on Power Semiconductor Devices and ICs (ISPSD'2000), May 2000, pp. 309-312.
Kojima et al., "A Novel Monolithic Isolator for a Communications Network Interface IC", 11th Annual IEEE International ASIC Conference, Sep. 1998, pp. 255-258.
Kuhn et al., "An RF-Based IEEE 1394 Ground Isolator Designed in a Silicon-on-Insulator Process", 44th IEEE Midwest Symposium on Circuits and Systems (MWSCAS 2001), Aug. 2001, pp. 764-767.
Kuisma, "Variable Frequency Switching in Power Supply EMI—Control: An Overview", IEEE AES Systems Magazine, Dec. 2003, pp. 18-22.
Lam et al., "High-Isolation Bonding Pad Design for Silicon RFIC up to 20 GHz", IEEE Electron Device Letters, vol. 24, No. 9, Sep. 2003, pp. 601-603.
Laughton et al., "Digital Control Systems", Electrical Engineers Reference Book, Sixteenth Edition, Chapter 14, Newnes, 2003, 3 cover sheets (unnumbered), pp. 14/6-14/9.
Ledwich, "DC-DC Converter Basics", Power Designers, 1998, www.powerdesigners.com, 11 pages.
Long et al., "A 1.9 GHz Low-Voltage Silicon Bipolar Receiver Front-End for Wireless Personal Communications Systems", IEEE Journal of Solid-State Circuits, vol. 30, No. 12, Dec. 1995, pp. 1438-1448.
Moss et al., "Integrated Circuit D-MOS Telephone Crosspoint Array," 1976 IEEE International Solid-State Circuits Conference (ISSCC 76), Digest of Technical Papers, vol. XIX, Feb. 1976, pp. 32-33, 226.
National Instruments, "Isolation Technologies for Reliable Industrial Measurements", Whitepaper, 2006, 11 pages.
National Instruments, "Technologies behind NI Industrial M and S Series Data Acquisition Devices with Isolation", NI Developer Zone, Oct. 3, 2007, 5 pages.
Ng et al., "Optimized Geometrical Features of Monolithic Spiral RF Transformers on Silicon", SAFE ProRISC SeSens 2001, Conference Proceedings, Nov. 2001, pp. 132-135.
Nihtianov, "Magnetogalvanic Approach to Isolation of Analog Circuits", IEEE Transactions on Instrumentation and Measurement, vol. 43, No. 4, Aug. 1994, pp. 677-680.
Niknejad et al., "Analysis, Design, and Optimization of Spiral Inductors and Transformers for Si RF ICs", IEEE Journal of Solid-State Circuits, vol. 33, No. 10, Oct. 1998, pp. 1470-1481.
NVE Corporation, "High Speed Digital Coupler", IL710 datasheet, Jul. 2002, 8 pages.
NVE Corporation, "High Speed Five-Channel Digital Isolators", IL260/IL261 datasheet, Rev. E, Apr. 2007, 11 pages.
Park et al., "Packaging Compatible Microtransformers on a Silicon Substrate", IEEE Transactions on Advanced Packaging, vol. 26, No. 2, May 2003, pp. 160-164.
Pickering, "A System Designer's Guide to Isolation Devices", Sensors, Jan. 1999, pp. 14-26 (7 pages).
PowerZONE, "ADuM1300/01/1400/01/02: Multi-Channel Digital Isolators for High-Voltage Industrial Applications", powerZONE Products for the week of May 26, 2003, 2 pages.
PR Newswire, "Electronics Technology Elite Compete for Industry's Highest Honors as EE Times Announces Finalists for 2007 EE Times ACE Awards", Jan. 15, 2007, 5 pages.

(56) References Cited

OTHER PUBLICATIONS

Pulse Engineering, "RF Transformers, Transformers for Wideband RF Applications", C244.A datasheet, Oct. 2004, 2 pages.
Ronkainen et al., "IC Compatible Planar Inductors on Silicon", IEE Proceedings—Circuits Devices Systems, vol. 144, No. 1, Feb. 1997, pp. 29-35.
Roth, Jr., "Clocked Flip-Flops with Clear and Preset Inputs", Fundamentals of Logic Design, Third Edition, 1985, 2 Cover Sheets (unnumbered), pp. 254-256.
Roth, Jr., "MOS and CMOS Logic", Fundamentals of Logic Design, Third Edition, 1985, 2 Cover Sheets (unnumbered), pp. 613-616.
Sayani et al., "Isolated Feedback for Off-Line Switching Power Supplies with Primary-Side Control", 3rd Annual IEEE Applied Power Electronics Conference and Exposition (APEC '88), Feb. 1988, pp. 203-211 (5 pages).
Shin et al., "A 250-Mbit/s CMOS Crosspoint Switch", IEEE Journal of Solid-State Circuits, vol. 24, No. 2, Apr. 1989, pp. 478-486.
Silicon Laboratories, "Global Line-Side DAA for Embedded System-Side Module," Si306x datasheet, Rev. 0.9, Jan. 2005, 62 pages.
Silicon Laboratories, "Quad-Channel Digital Isolator", Si8440/41/42/45 datasheet, Rev. 0.6, Aug. 2007, 30 pages.
Silicon Laboratories, "Silicon Laboratories Announces Industry's Fastest, Most Integrated Four Channel Digital Isolators", News Release, Mar. 20, 2006, 3 pages.
Silicon Laboratories, "Triple-Channel Digital Isolator", Si8430/31/35 datasheet, Rev. 0.3, Aug. 2007, 30 pages.
Simburger et al., "A Monolithic Transformer Coupled 5-W Silicon Power Amplifier with 59% PAE at 0.9 GHz", IEEE Journal of Solid-State Circuits, vol. 34, No. 12, Dec. 1999, pp. 1881-1892.
Small, "Medical Devices Demand Stringent Isolation Techniques", EDN, Sep. 28, 2006, pp. 41-49.
Standard Handbook for Electrical Engineers, "Carrier Communication, Tone Multiplex Equipment", Tenth Edition, McGraw-Hill, 1968, 2 Cover Sheets (unnumbered), pp. 15-75 and 15-84, 15-85.
Streetman, "Monolithic Device Elements", Solid State Electronic Devices, Second Edition, Prentice-Hall, 1980, 2 Cover Sheets (unnumbered), pp. 346-347.
Streetman, "Semiconductor Materials" and "Monolithic Device Elements", Solid State Electronic Devices, Third Edition, Prentice Hall, 1990, pp. 1-2 and p. 355.
Sugawara et al., "1.5 Gbps, 5150 ppm Spread Spectrum SerDes PHY with a 0.3 mW, 1.5 Gbps Level Detector for Serial ATA", IEEE 2002 Symposium on VLSI Circuits, Digest of Technical Papers, Jun. 2002, pp. 60-63.
Sze, "Physics and Properties of Semiconductors—A Resume", Physics of Semiconductor Devices, Second Edition, John Wiley & Sons, 1981, 2 Cover Sheets (unnumbered), and p. 7.
Tabisz et al., "Zero-Voltage-Switched Quasi-Resonant Buck and Flyback Converters—Experimental Results at 10MHz", IEEE Transactions on Power Electronics, vol. 4, No. 2, Apr. 1989, pp. 194-204.

Tang, et al., "A Low-Profile Low-Power Converter with Coreless PCB Isolation Transformer", IEEE Transactions on Power Electronics, vol. 16, No. 3, May 2001, pp. 311-315.
Tang, et al., "A Low-Profile Wide-Band Three-Port Isolation Amplifier with Coreless Printed-Circuit-Board (PCB) Transformers", IEEE Transactions on Industrial Electronics, vol. 48, No. 6, Dec. 2001, pp. 1180-1187.
Texas Instruments, "3.3-V / 5-V High-Speed Digital Isolators", ISO721 / ISO722 datasheet, Jan. 2006 (revised Feb. 2007), 24 pages.
Texas Instruments, "Dual Digital Isolators", ISO7220 / ISO7221 datasheet, Jul. 2006 (revised Aug. 2007), 25 pages.
Texas Instruments, "Quad Digital Isolators", ISO7240 / ISO7241 / ISO7242 datasheet, Sep. 2007 (revised Dec. 2007), 25 pages.
Tsang et al., "Design, Fabrication, and Performance of Spin-Valve Read Heads for Magnetic Recording Applications", IBM J. Res. Develop, vol. 42, No. 1, Jan. 1998, pp. 103-116.
Tse et al., "Analysis and Spectral Characteristics of a Spread-Spectrum Technique for Conducted EMI Suppression", IEEE Transactions on Power Electronics, vol. 15, No. 2, Mar. 2000, pp. 399-410.
Walker et al., "An Isolated MOSFET Gate Driver", Australasian Universities Power Engineering Conference (AUPEC '96), Oct. 1996, pp. 175-180.
Wedlock et al., "Capacitors", Electronic Components and Measurements, Prentice-Hall, 1969, 4 Cover Sheets (unnumbered), and p. 89.
Wolf, "Silicon Processing for the VLSI Era, vol. 2: Process Integration", Lattice Press, 1990, 2 Cover Sheets (unnumbered), pp. 66-69.
Zhou et al., "A Fully Integrated CMOS 900MHz LNA Utilizing Monolithic Transformers", IEEE International Conference on Solid-State Circuits, Feb. 5-7, 1998, Digest of Technical Papers, pp. 132-133.
Zhou et al., "Monolithic Transformers and Their Application in a Differential CMOS RF Low-Noise Amplifier", IEEE Journal of Solid State Circuits, vol. 33, No. 12, Dec. 1998, pp. 2020-2027.
Der et al. "A Switched-Capacitor Differencing Circuit with Common-Mode Rejection for Fully Differential Comparators," Proceedings of the 36th Midwest Symposium on Circuits and Systems, Aug. 1993, vol. 2, pp. 911-914.
Partial European Search Report issued Feb. 9, 2016, in European Application No. 15183918.0 (8 pages).
Gupta et al., "Asymmetric Cross-Coupled Differential Pair Confirguration to Realize Neuron Activation Function and Its Derivative", IEEE Transactions on Circuits and Systems II: Express Briefs, vol. 52, No. 1, Jan. 2005, pp. 10-13.
Partial European Search Report issued Feb. 9, 2016, in European Application No. 15183914.9 (9 pages).
Extended European Search Report mailed Jul. 1, 2016 for Application No. EP 15183918.0.

\* cited by examiner

100

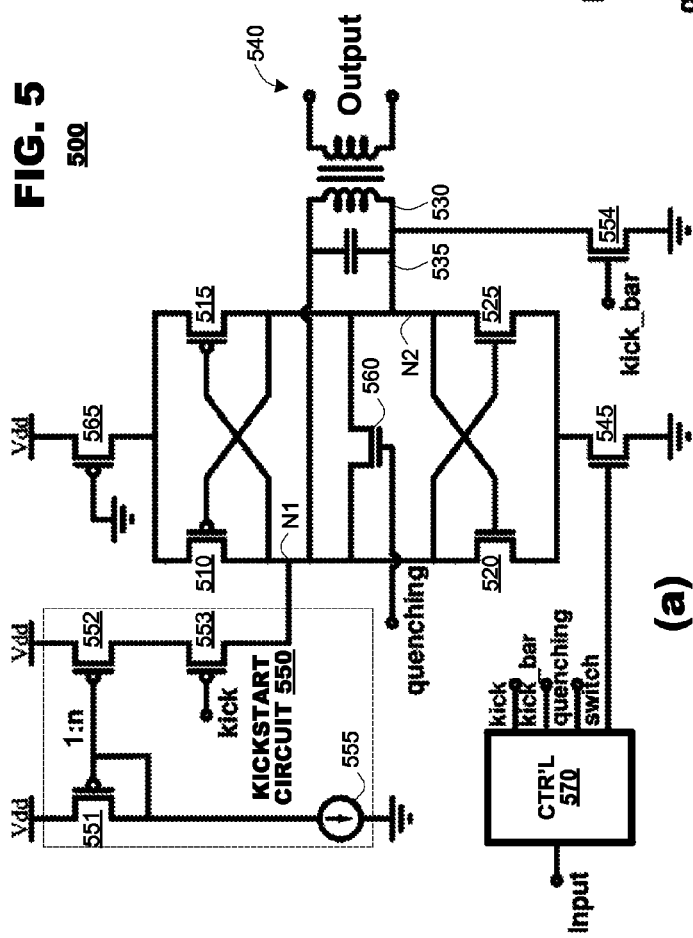
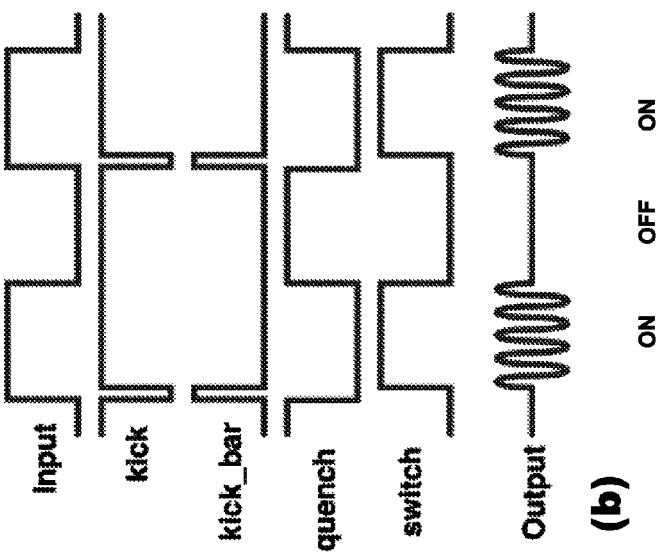
FIG. 5

700

600

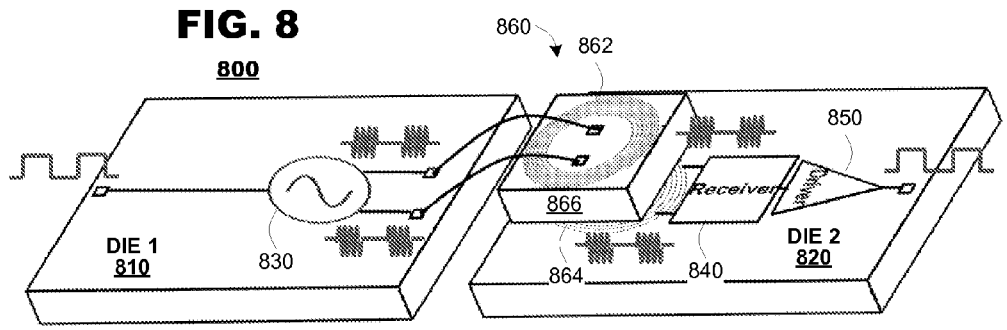
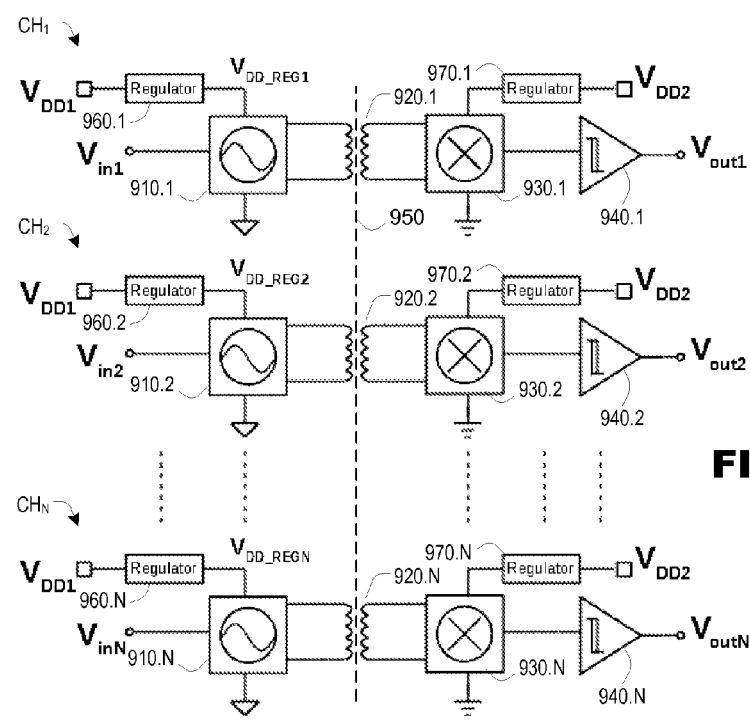

1000

US 9,660,848 B2

METHODS AND STRUCTURES TO GENERATE ON/OFF KEYED CARRIER SIGNALS FOR SIGNAL ISOLATORS

BACKGROUND

The present invention relates to signal isolators and, particularly, signal isolators that operate according to an on-off keyed signal protocol.

Isolators are devices that exchange data signals between two galvanically isolated circuit systems. The circuit systems each operate in different voltage domains, which may include different source potentials and different grounds. Isolation devices may provide data exchange across an isolation barrier, which maintains the galvanic isolation. Typical isolation devices include micro-transformers, capacitors, magneto-resistors/giant magneto-resistors and opto-electronic devices.

On-off keying ("OOK") is a signaling protocol that identifies a digital state based on the type of signal that is transmitted through the isolation barrier. A first digital data state (say, a digital "1") might be signaled by transmitting a periodic signal across the isolation barrier. A second digital data state (a digital "0") might be signaled by transmitting no signal across the isolation barrier. A receiver circuit would detect the presence or absence of the periodic signal and decode a digital output signal therefrom.

OOK-based signal isolators typically have inefficient designs. For example, isolator transmitters may include a high-frequency oscillator separate from the isolator device to generate a carrier that becomes the periodic signal. Moreover, transmitters often are power-hungry devices. Accordingly, the inventors perceive a need in the art for an improved transmitter architecture for OOK-based signal isolators.

BRIEF DESCRIPTION OF THE DRAWINGS

FIG. 5 illustrates a transmitter and exemplary signals therefor according to yet another embodiment of the present invention.

FIG. 8 is a schematic diagram illustrating an isolator system according to another embodiment of the present invention.

FIG. 9 illustrates an isolator system according to an embodiment of the present invention.

DETAILED DESCRIPTION

Embodiments of the present invention provide an oscillator circuit coupled to an isolator device, a control switch, and a quenching switch. The control switch may be coupled between the oscillator circuit and a voltage supply and may be controlled by an input signal to be transmitted by the system. The control switch, therefore, may gate operation of the oscillator between an ON and an OFF state. The quenching switch may be coupled between two components of the oscillator and may become conductive during a transition from an ON state of the oscillator to an OFF state to short current with the oscillator. Other embodiments may include a current injection circuit, coupled to the oscillator, that becomes active during a transition from an OFF state of the oscillator to an ON state of the oscillator as determined by the input signal.

Figure 1:
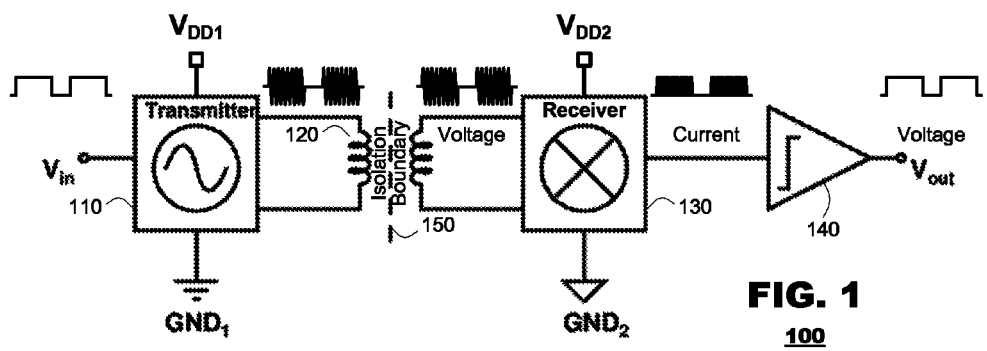
FIG. 1 illustrates an isolator system according to an embodiment of the present invention.

FIG. 1 illustrates an isolator system 100 according to an embodiment of the present invention. The system 100 may include a transmitter 110, an isolator 120, a receiver 130 and an output driver 140. The isolator 120 may span an isolation boundary 150, which galvanically isolates two voltage domains from each other. The transmitter 110 may belong to a first voltage domain, which possesses its own voltage and ground supplies (shown as $V_{DD1}$, $GND_1$), and the receiver 130 and output driver 140 may belong to a second voltage domain, which possesses separate voltage and ground supplies ($V_{DD2}$, $GND_2$) from the supplies of the first voltage domain. The isolation boundary 150 may prevent communication of voltages from one domain to the other.

The system 100 may be provided for communication of digital data from the first voltage domain to the second voltage domain by on-off keying ("OOK" for short). In such an embodiment, the transmitter 110 may receive an input signal that takes one of two binary voltage levels. The transmitter 110 may generate an output signal having a state that is determined from the state of the input signal. For example, if the input signal corresponds to a binary value of "1," the transmitter 110 may generate a periodic signal as its output but, if the input signal corresponds to a binary value of "0," the transmitter 110 may output an inert signal (no activity). This action of toggling between an active state and an inactive state based on the state of the input signal represents one example of an on-off keyed output.

The isolator 120 may be provided as a micro-transformer (shown in FIG. 1), capacitive isolators and/or a magneto-resistive isolator. The isolator 120 may receive the output from the transmitter 110 in the first voltage domain and pass a received signal to the receiver 130 in the second voltage domain. Although the received signal is illustrated as a copy of the OOK output that the isolator 120 receives from the transmitter 110, the received signal may include perturbations (not illustrated) that are induced into the signal by the isolator 120, for example, shifts in voltage, distortions induced by the isolator's temporal response and noise effects. The received signal may be provided to the receiver 130 as a voltage.

The receiver 130 may generate an OOK current signal from the signal supplied to it by the isolator 120. The output driver 140 may generate a binary voltage signal from the current signal supplied to it by the receiver 130. In an embodiment, the receiver 130 and output driver 140 may exchange current domain signals to provide a low latency output in response to OOK signals provided by the isolator 120.

FIG. 2(a) illustrates a transmitter 200 according to an embodiment of the present invention. The transmitter 200 may include a first pair of cross-coupled transistors 210, 215, a second pair of cross-coupled transistors 220, 225, an inductor 230 and a capacitor 235. The inductor 230 may be provided as a first winding 230 of a transformer 240 that forms the isolator 120 (FIG. 1) of the system. The transmitter 200 also may include a fifth transistor 245 for an input signal INPUT.

Two transistors 210 and 220 may be connected together at a first node N1. The other two transistors 215, 225 may be connected together at a second node N2. Gates of the transistors 210, 220 may be connected to the second node N2 and gates of the transistors 215, 225 may be connected to the first node N1. The transistors 210, 215 may have a doping type that is complementary to a doping type of the transistors 220, 225; thus, in the example illustrated in FIG. 2, transistors 210, 215 are shown as PMOS transistors and transistors 220, 225 are shown as NMOS transistors. The cross-connected inputs of the transistors may cause the transistors 210-225 to be rendered conductive and non-conductive in alternating sets. Specifically, when a voltage at node N1 causes transistor 215 to be conductive, that same voltage would cause transistor 225 to be non-conductive and, at the same time, a voltage at node N2 would cause transistor 220 to be conductive and transistor 210 to be non-conductive. Also, when a voltage at node N2 causes transistor 210 to be conductive, that same voltage would cause transistor 220 to be non-conductive and, at the same time, a voltage at node N1 would cause transistor 215 to be non-conductive and transistor 225 to be conductive.

The inductor 230 and the capacitor 235 may be connected in parallel between the nodes N1 and N2. Thus, when transistors 210 and 225 are conductive, an active path may be established from transistor 210 to node N1, further through inductor 230 and capacitor 235 to node N2 and to transistor 225 (illustrated in FIG. 2 as Path 1). Alternatively, when 215 and 220 are conductive, another active path may be established from transistor 215 to node N1, further through inductor 230 and capacitor 235 to node N2 and to transistor 220 (path not shown in FIG. 2). Thus, the capacitor 235, the inductor 230 and the transistors 210-225 form an oscillator.

In an embodiment, the capacitor 235 need not be provided as a discrete component of the transistor 200. Instead, the transmitter 200 may rely on a parasitic capacitance that is formed between nodes N1 and N2 by the cross-coupled transistors 210, 215, 220 and 225. In such an embodiment, the parasitic capacitance between these nodes coupled with the inductance provided by the transformer winding 230 may define an oscillation rate of the transmitter 200.

Optionally, the transmitter 200 may include a current limiting transistor 255 connected between a voltage supply $V_{DD}$ and the two transistors 210, 215. The current limiting transistor 255 may be connected to a predetermined bias voltage, shown as ground in the example of FIG. 2. As its name implies, the current limiting transistor 255 may limit the amount of current that is sourced to the oscillator when it is active. By limiting the current sourced into the oscillator, the current limiting transistor may improve common mode transient immunity of the isolator system.

FIG. 2(b) illustrates exemplary signals that may be generated during operation of the transmitter 200 in response to a binary input signal INPUT. In one state, shown as an "OFF" state, the INPUT signal may render its associated transistor 245 non-conductive, which in an ideal case may prevent current from flowing through any of the transistors 210-225. In this first state, the transmitter 200 would not drive a signal to the isolator 240.

In another state, shown as an "ON" state, the INPUT signal may render transistor 245 conductive, which may permit the transistors 210-225, inductor 230 and capacitor 235 to oscillate. Specifically, current may be allowed to flow between a first pair of transistors (say, transistors 210 and 225). The current may flow through the inductor 230 and may charge the capacitor 235. Eventually, voltages may be built up at the nodes N1, N2 that render the transistors 210, 225 non-conductive and begin to render the transistors 215, 220 conductive. This changing state of the transistors 210-225 may reverse orientation of the voltages built up in the inductor 230 and capacitor 235. The transmitter 200 may oscillate during operation, with the transistor pairs 210, 225 and 215, 220, becoming conductive and non-conductive in alternating fashion, as long as the INPUT signal remains in the ON state. The transmitter circuit 200 may drive an oscillating signal onto the inductor 230, which may drive the signal to a second winding 250 of the isolator 240. Such operation may continue for as long as the INPUT signal remains in the ON state.

Figure 2:
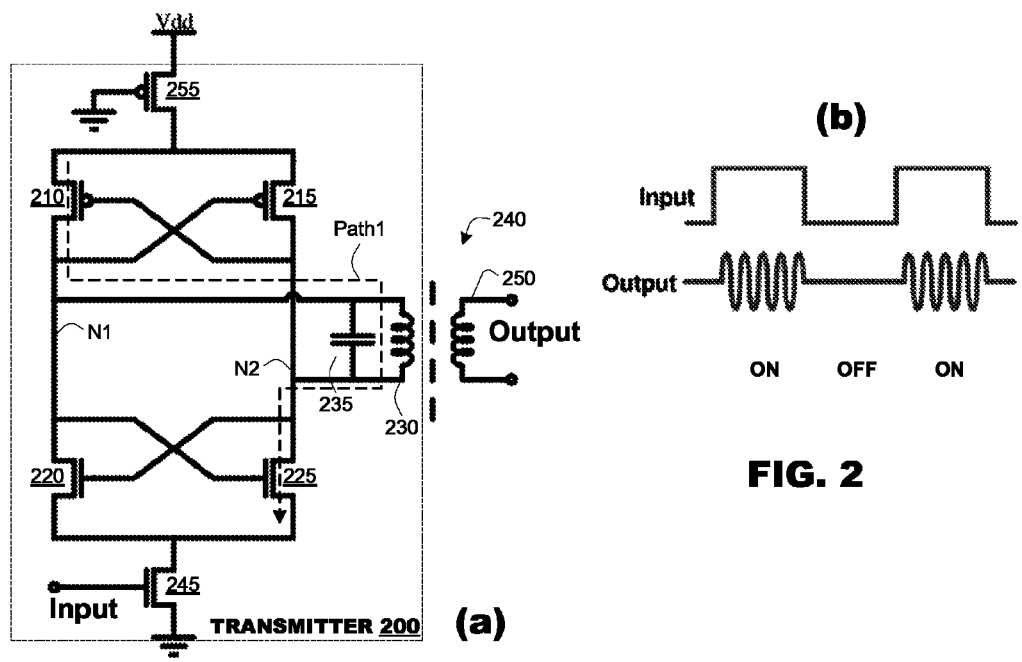
FIG. 2 illustrates a transmitter and exemplary signals therefor according to an embodiment of the present invention.

The circuit design of FIG. 2 advantageously uses inductive properties of an isolator device to generate an oscillating signal that will be transmitted across an isolation barrier in an OOK system. As compared to other designs, which may provide an inductor-capacitor (LC) oscillator that is separate from the isolator, the transmitter 200 of FIG. 2 achieves an OOK system with a smaller device count and reduced area. Inductors and transformer windings oftentimes are the most area intensive circuitry when LC circuits are manufactured as integrated circuits. Accordingly, the embodiment of FIG. 2 can achieve large area savings in such devices.

The oscillating inductor signal illustrated in FIG. 2 represents an idealized response of the transmitter 200 with an instantaneous generation and termination of oscillating signals in response to transitions of the INPUT signal. In practice, however, such circuits require time to build up the inductor signal to a full swing signal. Moreover, these circuits also require time to transition from full-swing oscillation to an inactive state. Thus, the inductor signal likely will deviate from the simulation illustrated in FIG. 2 when the transmitter 200 is fabricated in an integrated circuit.

FIG. 3(a) illustrates a transmitter 300 according to an embodiment of the present invention. The transmitter 300 may include a first pair of cross-coupled transistors 310, 315, a second pair of cross-coupled transistors 320, 325, an inductor 330 and a capacitor 335. The inductor 330 may be provided as a first winding 330 of a transformer 340 that forms the isolator 120 (FIG. 1) of the system. The transmitter 300 also may include a fifth transistor 345 for an input signal INPUT and a "kickstart" circuit 350.

Two transistors 310 and 320 may be connected together at a first node N1. The other two transistors 315, 325 may be connected together at a second node N2. Gates of the transistors 310, 320 may be connected to the second node and gates of the transistors 315, 325 may be connected to the first node N1. The transistors 310, 315 may have a doping type that is complementary to a doping type of the transistors 320, 325; thus, in the example illustrated in FIG. 3, transistors 310, 315 are shown as PMOS transistors and transistors 320, 325 are shown as NMOS transistors. The cross-connected inputs of the transistors may cause the transistors 310-325 to be rendered conductive and non-conductive in alternating sets. Specifically, when a voltage at node N1 causes transistor 315 to be conductive, that same voltage would cause transistor 325 to be non-conductive and, at the same time, a voltage at node N2 would cause transistor 320 to be conductive and transistor 310 to be non-conductive. Also, when a voltage at node N2 causes transistor 310 to be conductive, that same voltage would cause transistor 320 to be non-conductive and, at the same time, a voltage at node N1 would cause transistor 315 to be non-conductive and transistor 325 to be conductive. The capacitor 335, the inductor 330 and the transistors 310-325 may form an oscillator.

In an embodiment, the capacitor 335 need not be provided as a discrete component of the transmitter 300. Instead, the transmitter 300 may rely on a parasitic capacitance that is formed between nodes N1 and N2 by the cross-coupled transistors 310, 315, 320 and 325. In such an embodiment, the parasitic capacitance between these nodes, coupled with the inductance provided by the transformer winding 330, may define an oscillation rate of the transmitter 300.

Optionally, the transmitter 300 may include a current limiting transistor 360 connected between a voltage supply $V_{DD}$ and the two transistors 310, 315. The current limiting transistor 360 may be connected to a predetermined bias voltage, shown as ground in the example of FIG. 3. As its name implies, the current limiting transistor 360 may limit the amount of current that is sourced to the oscillator when it is active. By limiting the current sourced into the oscillator, the current limiting transistor may improve common mode transient immunity of the isolator system.

The kickstart circuit 350 may include a current mirror made of a pair of transistors 351, 352, a pair of control transistors 353, 354 and a current source 355. One of the control transistors 353 may be coupled to a first node N1 of the transmitter 300 and the second control transistor 354 may be coupled to the other node N2 of the transmitter 300. The current source 355 may be coupled to a first transistor 351 in the current mirror and the second transistor 352 may be coupled to one of the control transistors 353.

The control transistors 353, 354 may be controlled by a "kick" control signal, shown in FIG. 3(b) as kick and kick_bar. Transistor 353 is illustrated as a PMOS transistor, which may become conductive when the kick signal is low. Transistor 354 is illustrated as an NMOS transistor, which may become conductive when the kick_bar signal is high. The kick/kick_bar control signals may become active during a transition of the INPUT signal from an OFF state to an ON state. Thus, the kickstart circuit 350 may supply current to the oscillator during a transition from the OFF state to the ON state.

Consider the transmitter 300 during operation, when the oscillator has been in the OFF state for a prolonged period of time relative to its LC time constant. During such time, the capacitor 335 and inductor 330 likely store no energy. In the absence of contribution of the kickstart circuit, when the INPUT signal transitions from an OFF state to an ON state, the capacitor 335 and inductor 330 each would be charged by the voltage supply $V_{DD}$ provided through transistors 310 or 315. The time spent to charge the capacitor 335 and/or inductor 330 would increase the latency of signal transmission across the isolator boundary, which can slow throughput of the system.

Figure 3:
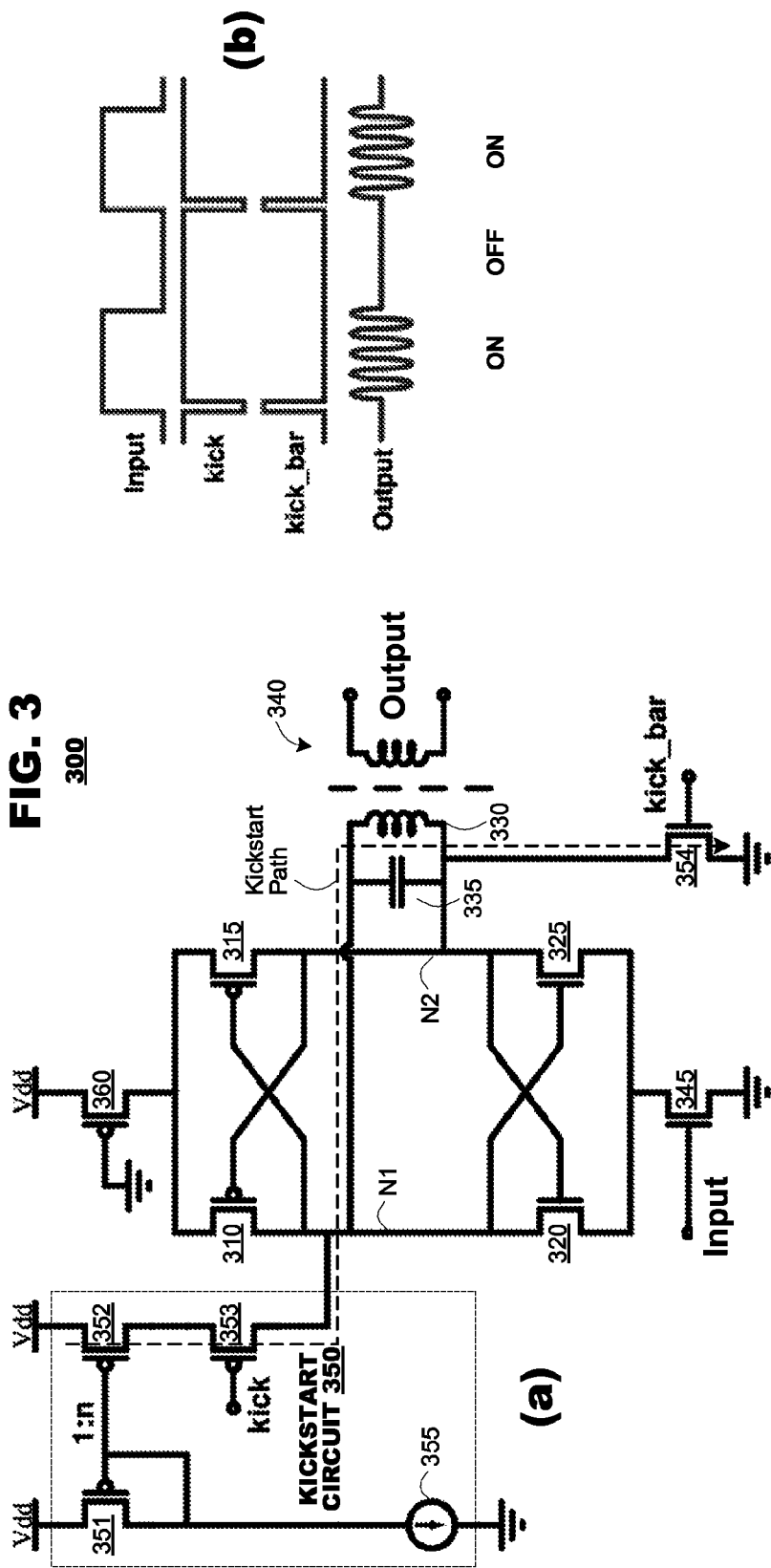
FIG. 3 illustrates a transmitter and exemplary signals therefor according to another embodiment of the present invention.

In the embodiment of FIG. 3, however, the kickstart circuit 350 may become active at the transition of the INPUT signal. Thus, the kickstart circuit 350 may supply current to the oscillator via a "Kickstart Path," which extends from control transistor 353, across the inductor 330 and capacitor 335 to the second control transistor 354. As its name implies, the current supplied by the kickstart circuit 350 may kick start operation of the oscillator. It may provide a current pulse to the oscillator to speed up the oscillator's rate of charge at start up. In this manner, the oscillator may build up to full swing operation faster than in other transmitter systems, which decreases latency of the transmitter and speeds up operation of the system as a whole.

In one embodiment, the mirror transistors 351, 352 may be mismatched transistors. That is, the size of the second mirror transistor 352, the one that feeds current to other components of the transmitter 300, may be larger than the first transistor 351 (shown as N times larger than transistor 351). Thus, the amount of current driven by the current source 355 and the size ratio of the transistors 351 and 352 may determine an amount of current that the kickstart circuit 350 furnishes to the other components of the transmitter 300. Circuit designers may tailor the amount of current that is delivered to the oscillator at start up by tuning the current source 355, the ratio of transistors 351 and 352 and the duration of the kickstart signal to individual application needs.

FIG. 4(a) illustrates a transmitter 400 according to an embodiment of the present invention. The transmitter 400 may include a first pair of cross-coupled transistors 410, 415, a second pair of cross-coupled transistors 420, 425, an inductor 430 and a capacitor 435. The inductor 430 may be provided as a first winding of a transformer 440 that forms the isolator 120 (FIG. 1) of the system. The transmitter 400 also may include a fifth transistor 445 for an input signal INPUT and a sixth transistor 450, called a "quenching" transistor.

Two transistors 410 and 420 may be connected together at a first node N1. The other two transistors 415, 425 may be connected together at a second node N2. Gates of the transistors 410, 420 may be connected to the second node and gates of the transistors 415, 425 may be connected to the first node N1. The transistors 410, 415 may have a doping type that is complementary to a doping type of the transistors 420, 425; thus, in the example illustrated in FIG. 4, transistors 410, 415 are shown as PMOS transistors and transistors 420, 425 are shown as NMOS transistors. The cross-connected inputs of the transistors may cause the transistors 410-425 to be rendered conductive and non-conductive in alternating sets. Specifically, when a voltage at node N1 causes transistor 415 to be conductive, that same voltage would cause transistor 425 to be non-conductive and, at the same time, a voltage at node N2 would cause transistor 420 to be conductive and transistor 410 to be non-conductive. Also, when a voltage at node N2 causes transistor 410 to be conductive, that same voltage would cause transistor 420 to be non-conductive and, at the same time, a voltage at node N1 would cause transistor 415 to be non-conductive and transistor 425 to be conductive. The capacitor 435, the inductor 430 and the transistors 410-425 may form an oscillator.

The inductor 430, the capacitor 435 and the quenching transistor 450 may be connected in parallel between the nodes N1 and N2. When the quenching transistor 450 is conductive, it shorts nodes N1 and N2 together. When the quenching transistor 450 is non-conductive, it permits the transistors 410-425, capacitor 435 and inductor 430 to oscillate as discussed in the foregoing embodiments. Specifically, transistors 410 and 425 may be conductive and form an active path from transistor 410 to node N1, further through inductor 430 and capacitor 435 to node N2 and to transistor 425. And, in another portion of oscillation, transistors 415 and 420 may form another active path from transistor 415 to node N1, further through inductor 430 and capacitor 435 to node N2 and to transistor 420.

As indicated, the quenching transistor 450 may short nodes N1 and N2 together when it is rendered conductive. The quenching transistor 450, therefore, may facilitate transition from an ON state to an OFF state by providing a low-impedance path that dissipates energy that may be stored in the inductor 430 and/or capacitor 435. Increasing the speed of transition from an ON state to an OFF state may reduce latency of transitions as they are communicated across the isolation barrier and, therefore, may improve throughput as a whole.

In an embodiment, the capacitor 435 need not be provided as a discrete component of the transmitter 400. Instead, the transmitter 400 may rely on a parasitic capacitance that is formed between nodes N1 and N2 by the cross-coupled transistors 410, 415, 420 and 425. In such an embodiment, the parasitic capacitance between these nodes, coupled with the inductance provided by the transformer winding 430, may define an oscillation rate of the transmitter 400.

Optionally, the transmitter 400 may include a current limiting transistor 455 connected between a voltage supply $V_{DD}$ and the two transistors 410, 415. The current limiting transistor 455 may be connected to a predetermined bias voltage, shown as ground in the example of FIG. 4. As its name implies, the current limiting transistor 455 may limit the amount of current that is sourced to the oscillator when it is active. By limiting the current sourced into the oscillator, the current limiting transistor may improve common mode transient immunity of the isolator system.

FIG. 4(b) illustrates exemplary signals that may find application in the transmitter 400 of FIG. 4(a). In the illustrated embodiment, the quenching transistor 450 is shown as an NMOS transistor that is rendered conductive in response to a control signal (called "QUENCHING") at a high voltage level. Other embodiments may use different types of transistors (say, a PMOS transistor) that are rendered conductive in response to a low control signal.

The QUENCHING signal is illustrated as transitioning high during a transition from an ON state to an OFF state of the oscillator. When this occurs, the quenching transistor 450 is rendered conductive, which shorts nodes N1 and N2 together. This shorts the plates of capacitor 435 together and the terminals of inductor 430 together, which causes the energy dissipation described above. In this manner, the oscillating OUTPUT signal is dampened quickly.

In the embodiment illustrated in FIG. 4(b), the QUENCHING signal is illustrated as active for the full duration of the INPUT signal. In such an embodiment, the QUENCHING signal may be provided as an inversion of the INPUT signal (essentially, input_bar). In other embodiments, the active period of the QUENCHING signal may be set shorter than the full duration of the INPUT signal if desired, so long as the active period has a sufficient duration to dissipate energy of the inductive and capacitive elements within the transmitter.

Figure 4:
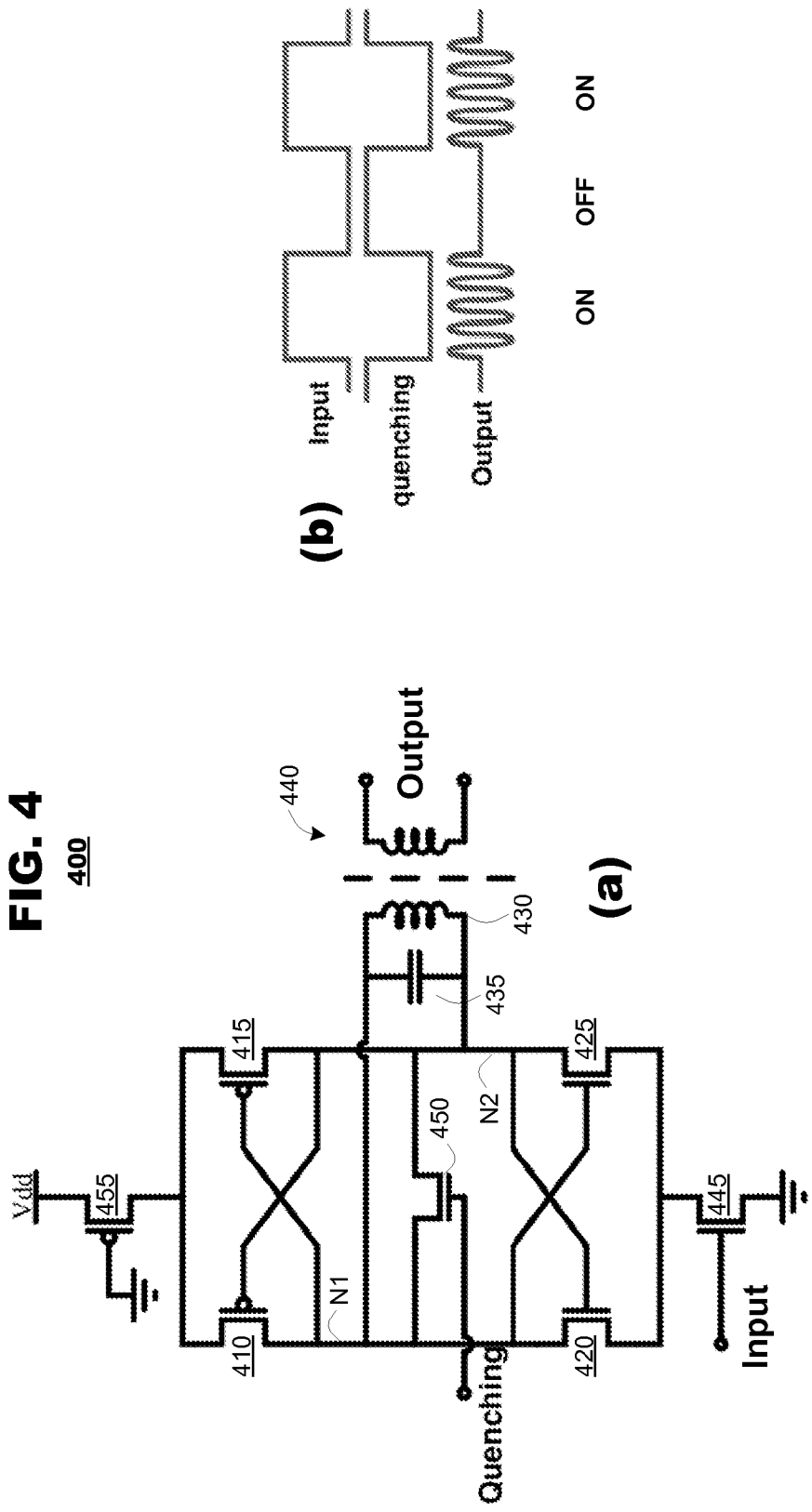
FIG. 4 illustrates a transmitter and exemplary signals therefor according to a further embodiment of the present invention.

The principles of FIGS. 3 and 4 may be integrated into a common transmitter, as shown in the embodiment of FIG. 5. There, a transmitter 500 may include a first pair of cross-coupled transistors 510, 515, a second pair of cross-coupled transistors 520, 525, an inductor 530 and a capacitor 535. The inductor 530 may be provided as a first winding of a transformer 540 that forms the isolator 120 (FIG. 1) of the system. The transmitter 500 also may include a fifth transistor 545 for a mode control signal (shown as "SWITCH"), a kickstart circuit 550, a quenching transistor 560 and a controller 570.

Two transistors 510 and 520 may be connected together at a first node N1. The other two transistors 515, 525 may be connected together at a second node N2. Gates of the transistors 510, 520 may be connected to the second node and gates of the transistors 515, 525 may be connected to the first node N1. The transistors 510, 515 may have a doping type that is complementary to a doping type of the transistors 520, 525; thus, in the example illustrated in FIG. 5, transistors 510, 515 are shown as PMOS transistors and transistors 520, 525 are shown as NMOS transistors. The cross-connected inputs of the transistors may cause the transistors 510-525 to be rendered conductive and non-conductive in alternating sets. Specifically, when a voltage at node N1 causes transistor 515 to be conductive, that same voltage would cause transistor 525 to be non-conductive and, at the same time, a voltage at node N2 would cause transistor 520 to be conductive and transistor 510 to be non-conductive. Also, when a voltage at node N2 causes transistor 510 to be conductive, that same voltage would cause transistor 520 to be non-conductive and, at the same time, a voltage at node N1 would cause transistor 515 to be non-conductive and transistor 525 to be conductive. The capacitor 535, the inductor 530 and the transistors 510-525 may form an oscillator.

The inductor 530, the capacitor 535 and the quenching transistor 560 may be connected in parallel between the nodes N1 and N2. When the quenching transistor 560 is conductive, it shorts nodes N1 and N2 together. When the quenching transistor 560 is non-conductive, it permits the transistors 510-525, capacitor 535 and inductor 530 to oscillate as discussed in the foregoing embodiments. Specifically, transistors 510 and 525 may be conductive and form an active path from transistor 510 to node N1, further through inductor 530 and capacitor 535 to node N2 and to transistor 525. And, in another portion of oscillation, transistors 515 and 520 may form another active path from transistor 515 to node N1, further through inductor 530 and capacitor 535 to node N2 and to transistor 520.

The kickstart circuit 550 may include a current mirror made of a pair of transistors 551, 552, a pair of control transistors 553, 554 and a current source 555. One of the control transistors 553 may be coupled to a first node N1 of the transmitter 500 and the second control transistor 554 may be coupled to the other node N2 of the transmitter 500. The current source may be coupled to a first transistor 551 in the current mirror and the second transistor 552 may be coupled to one of the control transistors 553.

In an embodiment, the capacitor 535 need not be provided as a discrete component of the transmitter 500. Instead, the transmitter 500 may rely on a parasitic capacitance that is formed between nodes N1 and N2 by the cross-coupled transistors 510, 515, 520 and 525. In such an embodiment, the parasitic capacitance between these nodes, coupled with the inductance provided by the transformer winding 530, may define an oscillation rate of the transmitter 500.

Optionally, the transmitter 500 may include a current limiting transistor 565 connected between a voltage supply $V_{DD}$ and the two transistors 510, 515. The current limiting transistor 565 may be connected to a predetermined bias voltage, shown as ground in the example of FIG. 5. As its name implies, the current limiting transistor 565 may limit the amount of current that is sourced to the oscillator when it is active. By limiting the current sourced into the oscillator, the current limiting transistor may improve common mode transient immunity of the isolator system.

The control transistors 553, 554 may be controlled by a kick control signal, shown in FIG. 5(b) as "kick" and "kick_bar." The control transistor 553 is illustrated as a PMOS transistor, which may become conductive when the kick signal is low. The control transistor 554 is illustrated as an NMOS transistor, which may become conductive when the kick_bar signal is high. The kick/kick_bar control signals may become active during a transition of the MODE signal from an OFF state to an ON state. Thus, the kickstart circuit 550 may supply current to the oscillator during a transition from the OFF state to the ON state.

The controller 570 may generate control signals to the kickstart circuit 550, the quenching transistor 560 and the switch transistor 545. FIG. 5(b) illustrates an exemplary set of such signals. Consider a situation where the input signal transitions from a low voltage level to a high voltage level. Before the transition of the input signal, the kick signal may be inactive (kick is set to a high voltage level and kick_bar is set to a low voltage level) and the quench signal may be set to an active level. In response to these signals, the kick control transistors 553 and 554 may be non-conductive and the quenching transistor 560 may be conductive.

When the input signal transitions from the low voltage to the high voltage, the controller 570 may deactivate the quenching signal and trigger the kick and kick_bar signals. Deactivation of the quenching signal may cause the quenching transistor to become non-conductive, severing the low impedance pathway between nodes N1 and N2. Activation of the kick and kick_bar signals may cause the kickstart circuit 500 to supply current to the inductor 530 and capacitor 535, which may begin oscillation. The kickstart circuit 550 may continue to supply current for a time during which the kick and kick_bar signal are active.

At the conclusion of the kickstart pulse duration, the controller 570 may deactivate the kick and kick_bar signals and activate the switch signal. Deactivation of the kick and kick_bar signals may cause the control transistors 553 and 554 to become non-conductive which prevents the kickstart circuit 500 from supplying further current to the oscillator. Activation of the SWITCH signal may cause the switch transistor 545 to become conductive, which may cause the oscillator to engage in normal operation. That is, oscillator operation may be governed by switching operation of transistors 510-525 as discussed above in ¶[48]. Oscillating operation may continue in this manner until the controller 570 changes state of the SWITCH signal, which may occur on a falling transition of the INPUT signal.

When the INPUT signal falls from a high voltage level to a low voltage level, the transmitter 500 should be in an OFF state. The controller 570 may deactivate the SWITCH signal and activate the QUENCH signal in response to a falling transition of the INPUT signal. Deactivation of the SWITCH signal may cause transistor 545 to become non-conductive, which may disable current flow between the current supplies $V_{DD}$ and ground. Activation of the QUENCH signal may cause the quenching transistor 560 to become conductive, which may dissipate energy that is stored in the capacitor 535 and the inductor 530. The controller 570 may maintain the transmitter 500 in the OFF state until a rising transition occurs in the INPUT signal, whereupon the controller 570 may activate the kick and kick_bar signals and deactivate the quenching signal as discussed above.

Figure 6:
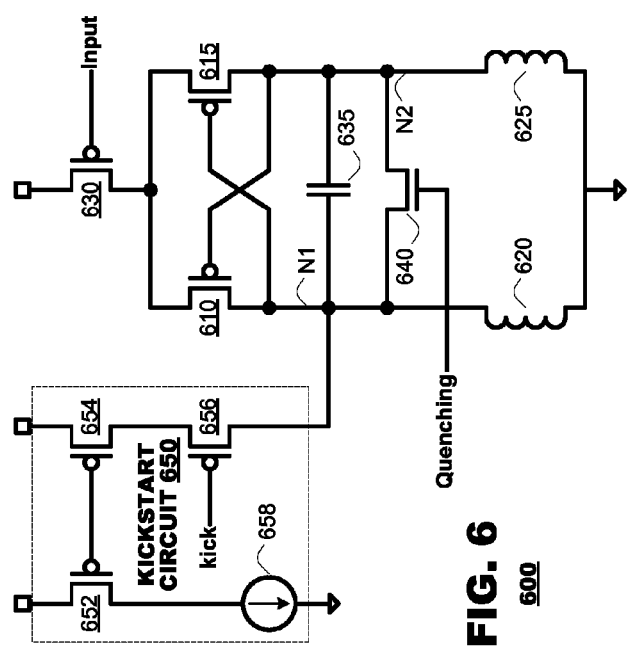
FIG. 6 illustrates a transmitter according to another embodiment of the present invention.

The principles of the present invention also find application in a transmitter architecture that uses only two pairs of cross-coupled transistors in an oscillator. FIG. 6 illustrates such an embodiment. There, an oscillator may be formed by a pair of cross-coupled transistor 610, 615, a pair of inductors 620, 625 and a capacitor 635. Again, in certain embodiments, the capacitor 635 may be a virtual device formed from parasitic capacitances provided by the transistors 610, 615. A transistor 630 may be connected between the oscillator and one of the voltage supplies ($V_{DD}$ in this example).

In this example, a quenching transistor 635 may be provided between a pair of nodes N1, N2 from which the cross-coupled transistors take their inputs (across the capacitance 635). It may become active to facilitate transition from an ON state to an OFF state. A kickstart circuit 650 may be connected to one of the nodes (N1) and may inject current into the oscillator to facilitate transition from an OFF state to an ON state.

Figure 7:
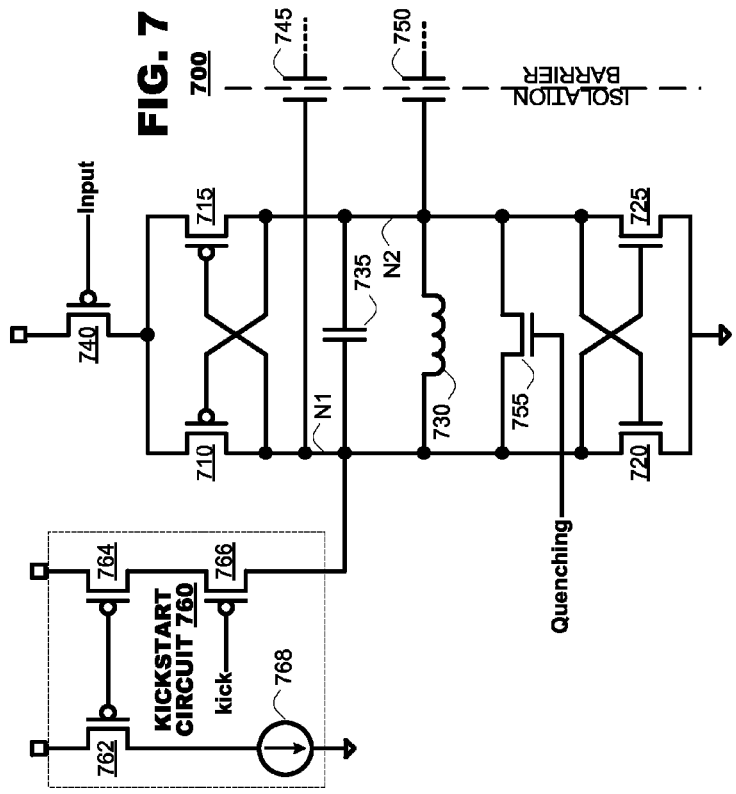
FIG. 7 illustrates a transmitter according to a further embodiment of the present invention.

As discussed, the principles of the present invention also find application with different types of isolator devices. FIG. 7 illustrates a transmitter 700 that may find application in an embodiment having capacitor-based isolators. In this embodiment, the transmitter 700 may include an oscillator formed from two pairs of cross-coupled transistors 710, 715, 720 and 725, an inductor 730 and a capacitor 735. The inductor 730 and capacitor 735 may be coupled between nodes N1 and N2 at which the inputs of the cross-coupled transistor 710, 715, 720 and 725 may take their inputs. A transistor 740 may be coupled between a voltage supply (VDD, in this example) and the oscillator and may take its input from the input signal to be transmitted by the transmitter 700.

The isolator devices 745, 750, in this embodiment, may be capacitors. A first terminal of the first capacitor 745 may be coupled to one of the nodes N1 and a first terminal of the second capacitor 750 may be coupled to a second one of the nodes N2. Second terminals of the capacitors 745, 750 may be provided on an opposite side of an isolation barrier from a side in which the transmitter 700 is located.

FIG. 7 illustrates application of a quenching transistor 755 and a kick start circuit 760 to this embodiment. The quenching transistor 755 may be provided between the nodes N1, N2 from which the cross-coupled transistors take their inputs (across the capacitance 735). It may become active to facilitate transition from an ON state to an OFF state. A kickstart circuit 760 may be connected to one of the nodes (N1) and may inject current into the oscillator to facilitate transition from an OFF state to an ON state.

FIG. 8 is a schematic diagram illustrating a circuit arrangement for signal isolator system 800 according to an embodiment of the present invention. There, the isolator system 800 may include a pair of semiconductor dies 810, 820 each galvanically isolated from the other. As discussed, the dies each may have their own voltage supplies and ground references. In the example of FIG. 8, the first die 810 may include a transmitter 830, and the second die 820 may include a receiver 840 and an output driver 850. The transmitter 830 and receiver 840 may be separated by an isolation device 860 formed of a first winding 862 and a second winding 864 separated by a dielectric layer 866. The second winding 864 may form part of the receiver 840 and may be provided in the second die 820 with the receiver 840. The first winding 862 may form part of the transmitter 830 and may be provided over the second die 820 in proximity to the second winding 864. The dielectric layer 866 may define the isolation barrier between the first and second dies; a breakdown voltage of the dielectric layer 866 may determine how much isolation protection is afforded by the signal isolator system 800.

As shown in FIG. 9, the signal isolator system may be replicated to provide additional channels $CH_1$-$CH_N$ of communication between the dies. First, individual channels $CH_1$, $CH_2$, . . . , $CH_N$ of transmitter-receivers may be replicated in a first orientation for transmission of data in a first direction (illustrated as left to right transmission in FIG. 9) across an isolation barrier 950. Replication of the channels CH1-CH2 may provide multiple channels of unidirectional communication from the first die 810 to the second die 820 (FIG. 8). Additionally, such channels may be replicated and reversed in orientation (right to left signal transmission) to provide one or more channels of unidirectional communication from the second die 820 to the first die 810 (channels not shown). Such implementations are within the spirit and scope of the present invention.

In such embodiments, each of the channels $CH_1$, $CH_2$, ..., $CH_N$ may include a respective transmitter 910.1-910.N, isolator 920.1-920.N, receiver 930.1-930.N and output driver 940.1-940.N. The isolators 920.1-920.N may span an isolation boundary 950, which galvanically isolates two voltage domains from each other. The transmitters 910.1-910.N may generate OOK output signals from the input signals $V_{IN1}$-$V_{INN}$ and deliver them to their respective isolators 920.1-920.N. The receivers 930.1-930.N may generate an OOK current signal from the signals supplied to them by their respective isolators 920.1-920.N. The output driver 940.1-940.N may generate a binary voltage signal from the current signal supplied to it by their respective receivers 930.1-930.N. Thus, multiple signal channels $CH_1$, $CH_2$, ..., $CH_N$ may communicate data from a first side of an isolation barrier 950 to a second side. The channel structures may be replicated and reversed in orientation to communicate signals from the second side of the isolation barrier 950 to the first side.

In an embodiment, the channels $CH_1$-$CH_N$ may include voltage regulators 960.1-960.N and 970.1-970.N provided on the transmitter-side of the channels, on the receiver-side of the channels or both. These regulators may lower supply voltages ($V_{DD1}$, $V_{DD2}$) to the respective transmitter, receiver components to save power and to minimize oscillator amplitude variations across power supply ranges. In some applications, oscillator operations can generate "ripples" in supply voltages within the transmitters 910.1-910.N and/or receivers 930.1-930.N; the presence of voltage regulators 960.1-960.N and 970.1-970.N can mitigate such effects in the voltage supplies $V_{DD1}$ and $V_{DD2}$ which can reduce cross-talk effects that may occur between channels.

Figure 10:
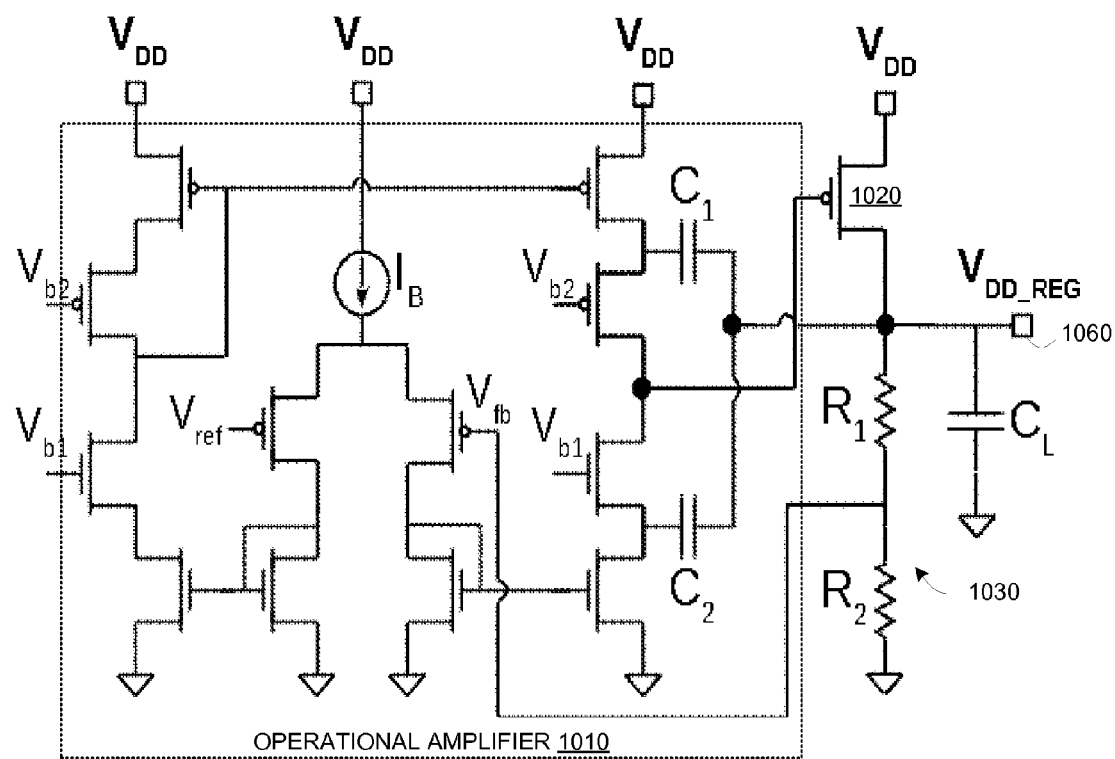
FIG. 10 is a circuit diagram of a voltage regulator according to an embodiment of the present invention.

FIG. 10 illustrates a circuit diagram of a voltage regulator 1000 according to an embodiment of the present invention. The voltage regulator 1000 may include an operational amplifier (also "op amp") 1010, a supply transistor 1020, a voltage divider 1030 and a load capacitor $C_L$. The voltage regulator 1000 may have an output terminal 1040 that may be connected to other circuit elements, for example, a transmitter or receiver of the foregoing embodiments.

The op amp 1010 may have inputs for a reference voltage Vref and for a feedback voltage Vfb that is generated by the voltage divider 1030. An output of the op amp 1010 may be coupled to a gate of the supply transistor 1020. The op amp 1010 may include capacitors C1 and C2 that are integrated within an integrated circuit in which the op amp 1010 is manufactured. An output node 1060 of the regulator 1000 may be coupled to an intermediate node in a current path to which the capacitors C1 and C2 are coupled.

The voltage regulator 1000 may operate to keep a voltage VDD_REG at an output node 1040 at a predetermined level. The supply transistor 1020 and the load capacitor $C_L$ may be coupled between a supply voltage VDD and the output node 1040. The voltage divider 1030 may be coupled between a second supply voltage (ground) and the output node 1040. The voltage divider 1030 may be provided as a pair of series-connected elements having impedances R1 and R2. The impedance elements may be provided as resistors, biased transistors or other devices having predetermined impedances At steady state operating conditions, the op amp 1010 may operate to maintain a voltage at an intermediate node within the voltage divider 1030 at a level that matches Vref (e.g., $V_{fb}=V_{ref}$). The voltage at the output node may be maintained at a voltage as $$\text{VDD\_REG} = \frac{R_1 + R_2}{R_2} V_{fb}.$$

The load capacitor CL may be charged to this level VDD_REG. The supply transistor 1020 may be controlled to source operating current to a load device (not shown) via the output node 1040.

When transients occur, a load device (not shown) either may pull or may push current to the output node 1040. When a transient causes a pull of current from the output node, such current may be sourced by the load capacitor CL and capacitors C1 and C2, which will help force the transistors 1404 to be more conductive to supply that current. In this manner, such transients are less likely to be passed back to voltage supply circuitry (not shown) that sources VDD. When a transient causes a push of current to the output node, such current may cause a voltage pushback, via the capacitors C1 and C2 to the gate of the supply transistor 1020. The supply transistor 1020 may become less conductive than at steady state operation, which may insulate the voltage supply circuitry (not shown) that sources VDD from the transient effect of the current push. Accordingly, the voltage regulator 1000 may immunize (to a degree) voltage supply circuitry from transient effects that otherwise might be imposed by changing operating conditions of a transmitter or a receiver.

As illustrated in FIG. 1, the transmitters of the foregoing embodiments may be used cooperatively with a receiver 130 that operates in a separate voltage domain that is isolated from a voltage domain of the transmitter 110 by an isolation boundary 150. Exemplary receivers are illustrated in a co-pending application, filed on even date herewith, entitled "Demodulation of On-Off-Key Modulated Signals in Signal Isolator Systems," Ser. No. 14/486,951, the disclosure of which is incorporated herein by reference.

The foregoing description has presented a transmitter circuit for an on-off keyed signal isolator that conserves component count and provides fast transitions between ON and OFF states. Although the foregoing embodiments have illustrated the transmitter in the context of exemplary operations and signal protocols, the principles of the present invention are not limited to the embodiments described. For example, it is permissible for a transmitter to enter an ON oscillation state when an input signal has a low voltage level, rather than a high voltage level as described hereinabove, and to enter an OFF oscillation state when the input signal has a high voltage level. Moreover, the system may be configured to operate using a single kick signal rather than complementary kick and kick_bar signals as illustrates. Further, the system may operate using an active low QUENCHING signal rather than an active high signal as illustrated in some embodiments. Such variations fall within the operating principles of the present invention. And, while MOS transistors have been illustrated herein, the principles of the present invention find application with other process technologies, for example, bipolar junction transistors and junction field effect transistors.

Several embodiments of the invention are specifically illustrated and/or described herein. However, it will be appreciated that modifications and variations of the invention are covered by the above teachings and within the purview of the appended claims without departing from the spirit and intended scope of the invention. Further variations are permissible that are consistent with the principles described above.

We claim:

1. A transmitter system for a signal isolator system, comprising:
    an oscillator circuit coupled to an isolator device,
    a control switch, coupled between the oscillator circuit and a constant voltage node, having an input for an input signal to be transmitted by the system; and
    accelerating means for accelerating transition of the oscillator circuit on a transition between an ON state and an OFF state as determined by the input signal.

2. The system of claim 1, where the accelerating means includes a switch, coupled between two components of the oscillator, and configured to short circuit an LC circuit coupled to the oscillator circuit.

3. The system of claim 1, wherein the accelerating means includes a current injection circuit, coupled to the oscillator circuit, configured to couple a current source to an LC circuit coupled to the oscillator circuit.

4. A transmitter system for a signal isolator system, comprising:
    an oscillator coupled to an isolator device,
    a control switch, coupled between the oscillator and a constant voltage node, having an input for an input signal to be transmitted by the system; and
    a quenching switch, coupled between two components of the oscillator, that becomes conductive during a transition from an ON state of the oscillator to an OFF state of the oscillator as determined by the input signal.

5. The transmitter system of claim 4, wherein the isolator device comprises a transformer, a first winding of which is an inductor of the oscillator.

6. The transmitter system of claim 4, wherein the isolator device comprises a capacitor.

7. The transmitter system of claim 4, wherein the oscillator comprises:
    an inductor connected between first and second nodes;
    a first pair of cross-coupled transistors, including:
        a first transistor coupled between the first node and a first voltage supply and having a control input coupled to the second node, and
        a second transistor coupled between the second node and the first voltage supply and having a control input coupled to the first node, and
    a second pair of cross-coupled transistors, including:
        a third transistor one coupled between the first node and a third node and having a control input coupled to the second node, and
        a fourth transistor coupled between the second node and the third node and having a control input coupled to the first node.

8. The transmitter system of claim 4, wherein the oscillator comprises:
    a capacitor connected between first and second nodes;
    a pair of cross-coupled transistors, including:
        a first transistor coupled between the first node and a first voltage supply and having a control input coupled to the second node, and
        a second transistor coupled between the second node and the first voltage supply and having a control input coupled to the first node, and
    a pair of inductors, including:
        a first inductor coupled between the first node and a second voltage supply, and
        a second inductor coupled between the second node and the second voltage supply.

9. The transmitter system of claim 4, further comprising a current injection circuit, coupled to the oscillator, and configured to become active during a transition from an OFF state of the oscillator to an ON state of the oscillator as determined by the input signal.

10. The transmitter system of claim 4, further comprising a voltage regulator coupled between the constant voltage node and the oscillator.

11. A transmitter system for a signal isolator system, comprising:
    an oscillator coupled to an isolator device,
    a control switch, coupled between the oscillator and a constant voltage node, having an input for an input signal to be transmitted by the system; and
    a current injection circuit comprising a plurality of transistors and coupled to the oscillator, wherein at least one of the plurality of transistors is configured to become conductive during a transition from an OFF state of the oscillator to an ON state of the oscillator as determined by the input signal.

12. The transmitter system of claim 11, wherein the isolator device comprises a transformer, a first winding of which is an inductor of the oscillator.

13. The transmitter system of claim 11, wherein the isolator device comprises a capacitor.

14. The transmitter system of claim 11, further comprising a quenching switch, coupled between two capacitor plates, configured to become conductive during a transition from an ON state of the oscillator to an OFF state of the oscillator as determined by the input signal.

15. The transmitter system of claim 11, wherein the oscillator comprises:
    an inductor connected between first and second nodes;
    a first pair of cross-coupled transistors, including:
        a first transistor coupled between the first node and a first voltage supply and having a control input coupled to the second node, and
        a second transistor coupled between the second node and the first voltage supply and having a control input coupled to the first node, and
    a second pair of cross-coupled transistors, including:
        a third transistor coupled between the first node and a third node and having a control input coupled to the second node, and
        a fourth transistor coupled between the second node and the third node and having a control input coupled to the first node.

16. The transmitter system of claim 11, wherein the oscillator comprises:
    a capacitor connected between first and second nodes;
    a pair of cross-coupled transistors, including:
        a first transistor coupled between the first node and a first voltage supply and having a control input coupled to the second node, and
        a second transistor coupled between the second node and the first voltage supply and having a control input coupled to the first node, and
    a pair of inductors, including:
        a first inductor coupled between the first node and a second voltage supply, and
        a second inductor coupled between the second node and the second voltage supply.

17. The transmitter system of claim 11, further comprising a voltage regulator coupled between the constant voltage node and the oscillator.

18. A method of managing transitions in an ON-OFF signal isolation system, comprising:
- selectively driving an oscillator from a first circuit path in response to an input signal to be transmitted across an isolation barrier, wherein the oscillator is driven to an ON state for one state of the input signal and is driven to an OFF state for another state of the input signal;
- when the input signal transitions between an ON state and an OFF state, engaging a second circuit path, ancillary to the first circuit path, to alter an amount of current passing through the oscillator.

19. The method of claim 18, comprising, when the input signal changes state to cause the oscillator to transition from an OFF state to the ON state, injecting current into the oscillator from the second circuit path.

20. The method of claim 18, wherein, when the input signal changes state to cause the oscillator to transition from an ON state to the OFF state, the second circuit path is a shorting current path within the oscillator.

21. The method of claim 20, wherein the shorting current path remains active for an entire duration of the OFF state.

22. The method of claim 20, wherein the shorting current path remains active only for an initial portion of the OFF state.

23. The method of claim 19, further comprising terminating the current injection after a predetermined portion of the ON state has elapsed.

24. The method of claim 18, further comprising repeating the method for each of a plurality of transmission channels.

25. A multi-channel transmitter system for a signal isolator system, comprising:
- a plurality of channels for transmission of respective signals across an isolation barrier, including first and second channels each comprising a transmitter and an isolator device, wherein the transmitter of each of the first and second channels comprises:
- an oscillator circuit coupled to the isolator device of the channel,
- a control switch, coupled between the oscillator circuit and a constant voltage node, having an input for an input signal to be transmitted by the system; and
- accelerating means for accelerating transition of the oscillator circuit on a transition between an ON state and an OFF state as determined by the input signal.

26. The system of claim 25, wherein the accelerating means is a current injection circuit, coupled to the oscillator circuit, configured to become active during a transition from an OFF state of the oscillator circuit to an ON state of the oscillator as determined by the input signal.

27. The system of claim 25, wherein the accelerating means is a quenching switch, coupled between two components of the oscillator circuit, configured to become conductive during a transition from an ON state of the oscillator circuit to an OFF state of the oscillator as determined by the input signal.

28. The system of claim 25, wherein the transmitters of the first and second channels each transmit their respective signals in a common direction across the isolation barrier.

29. The system of claim 25, wherein:
- at least one transmitter transmits its respective signal in a first direction across the isolation barrier and
- at least one other transmitter transmits its respective signal in a second direction across the isolation barrier, opposite the first direction.

* * * * *